United States Patent
Nishioka

(10) Patent No.: US 6,556,036 B2
(45) Date of Patent: Apr. 29, 2003

(54) SEMICONDUCTOR INTEGRATED CIRCUIT DEVICE

(75) Inventor: Kei Nishioka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1 day.

(21) Appl. No.: 09/894,332

(22) Filed: Jun. 27, 2001

(65) Prior Publication Data

US 2002/0000827 A1 Jan. 3, 2002

(30) Foreign Application Priority Data

Jun. 30, 2000 (JP) .................................... 2000-198062

(51) Int. Cl.$^7$ ................................................ G01R 31/26
(52) U.S. Cl. .................................... 324/765; 324/158.1
(58) Field of Search ........................ 324/765, 763, 324/158.1; 365/201, 4, 7, 154, 174, 194, 230.07, 230.08; 714/783

(56) References Cited

U.S. PATENT DOCUMENTS 5,723,993 A * 3/1998 Cha .......................... 327/165
5,796,682 A * 8/1998 Swapp ....................... 368/117
6,097,674 A * 8/2000 Swapp ....................... 368/113
6,275,055 B1 * 8/2001 Hyozo et al. ............. 324/158.1

* cited by examiner

Primary Examiner—Kamand Cuneo
Assistant Examiner—Tung X. Nguyen
(74) Attorney, Agent, or Firm—Hogan & Hartson, LLP

(57) ABSTRACT

A semiconductor integrated circuit device (IC) 10 incorporates an array Dch of measurement elements D1–Dm in the form of buffers for example connected in series. These elements represent standard internal elements of the IC 10. The array Dch is supplied with a signal in synchronism with a fast clock signal CLK of the IC 10. The propagation speed of the signal is given in terms of the number of the measurement elements through which the propagation signal has passed in one clock interval. This can be done by simply supplying the IC 10 with a test signal GO and a reset signal RES as the instruction signals from an external tester. A tester slower in the operating frequency than the IC 10 can be used to measure the propagation speed of the IC 10.

7 Claims, 3 Drawing Sheets

SEMICONDUCTOR INTEGRATED CIRCUIT DEVICE

FIELD OF THE INVENTION

The invention relates to a semiconductor integrated circuit device (IC) whose operating frequency can be checked easily using a simple testing apparatus.

BACKGROUND OF THE INVENTION

A tester is used in different tests to measure and assess performance of an IC. The tests include, for example, DC test, switching test, and function tests. Assessment of performance includes measurement of operating frequency of IC.

Recent ICs are designed to operate at a high clock speed (or clock frequency), often in the range of 100–200 MHz. Performance of such high-speed IC can be assessed through various kinds of tests including a DC test, a switching test, and a function tests for example by analyzing an actual critical path of the IC (which is the longest path requiring the longest propagation time between the input and output ends of the IC) and establishing a function pattern for the critical path. This can be done by means of a tester which can respond to the high speed clock signal of the IC.

However, it is much too heavy a burden to provide a large number of such high speed testers in testing mass-produced ICs and innovate them to meet new testing requirements every time ICs are redesigned for an improvement in a short period. An analysis of actual critical path of an IC requires many hours, and so does establishing the function pattern of the IC. Furthermore, the analysis for the critical path and the formation of the function pattern must be redone every time the circuit is modified.

It is possible to perform many tests on an IC with a tester having a slower operating frequency than the IC. However, slower testers cannot measure the operating frequencies of the internal elements of an IC, that is, they fail to measure the propagation speed of a signal within an IC.

SUMMARY OF THE INVENTION

Therefore, it is an object of the invention to provide an IC equipped with speed measurement means capable of measuring the operating frequencies of the internal elements thereof using a tester having a slower operating frequency than the IC itself.

In accordance with one aspect of the invention, there is provided an IC having a multiplicity of elements, comprising:

a predetermined number of measuring elements connected in series to form an array; and detection means for simultaneously detecting the electric potentials at a multiplicity of predetermined nodes of the measuring elements and outputting the detected potentials in numerical data.

The detection means comprises:

a multiplicity of latch circuits which operate in response to the latch signal; and a decoder for receiving the outputs of the latch circuits and converting the outputs received into numerical data, which data is provided at the output terminal of the decoder.

The array of the measuring elements is supplied at the input terminal thereof with a propagation signal. The latch circuits are provided with a delayed latch signal a predetermined time later after the application of said propagation signal to the array.

As a result, the propagation of the signal, i.e. varying potential along the array is latched in the latch circuits simultaneously after a predetermined time subsequent to the application of the signal to the input terminal of the array. The latched propagation signal is output in the form of numerical data for the IC, which results in the propagation speed of the signal through the internal elements, hence the operating frequency of the internal elements. Hence, measurement of the operating frequency of an IC can be made by a tester operating slower than the IC.

In the invention, the IC is provided with a pulse signal generator which generates a propagation signal in response to an externally applied instruction signal and in synchronism with a given clock signal, and generates the latch signal delaying behind the propagation signal by a predetermined number of clocks. The pulse generator is configured to provide the decoder with a decode signal delaying behind the latch signal by an arbitrarily time.

Thus, by simply providing an instruction signal from an external device (e.g. tester) arbitrarily, a propagation signal is generated, which propagates along the array for an arbitrary number of clocks (e.g. 1 clock) in synchronism with the clock until it is latched in the latch circuits, thereby providing numerical information on the propagation of the signal.

The internal clock signal of the IC under measurement may be used as the clock signal for the measurement. In this case, no external clock for the measurement is necessary. Then the propagation speed of a signal in the IC operating at the nominal operating frequency is obtained directly from the measurement.

Alternatively, the clock signal may be provided by an external device having a desired operating frequency. In this case, frequency of the measurement is not limited to the frequency of the internal clock, that is, the measurement frequency can be arbitrary. In addition, a higher resolution of the measurement can be obtained by performing the measurement at different frequencies.

Buffers may be used as the representatives of standard elements of an IC.

DETAILED DESCRIPTION OF THE PREFERRED EMBODIMENT

A first IC embodying the invention will now be described with reference to FIGS. 1–3.

Figure 1:
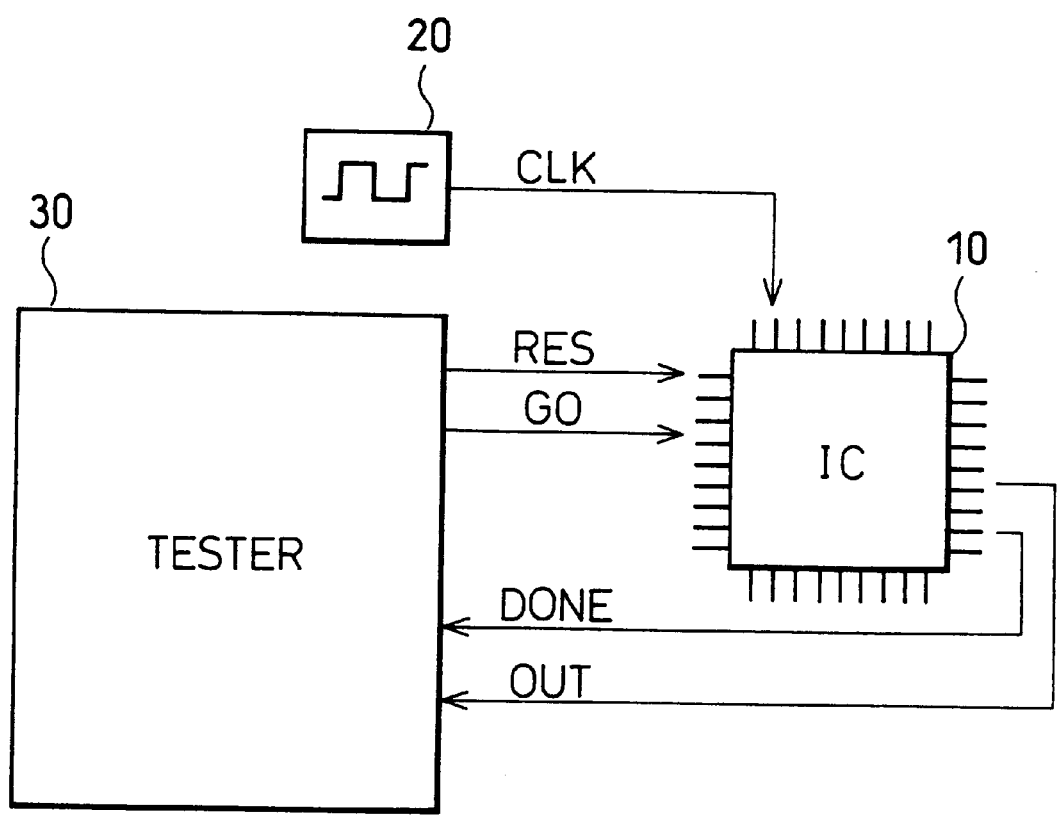
FIG. 1 is a schematic diagram of an IC under measurement, showing the concept of the measurement according to the invention.

Referring to FIG. 1, there is shown an IC 10 of the invention, which has many internal elements including a built-in measurement circuit for measuring the operating frequency of the internal elements.

The IC 10 is provided with an external clock signal CLK of a clock generator 20 having the same operating speed (or clock frequency) as the nominal clock frequency, 100 MHz for example, of the IC 10. However, the frequency of the clock signal CLK is not limited to the nominal clock frequency. It can be any other frequency, e.g. 80 MHz or 120

MHz. Different clock frequencies can be used by switching between different signals. In setting the clock signal to the nominal frequency, the external clock is substituted for by the internal clock of the IC.

A tester 30 is used to supply the IC 10 with instruction signals including a test signal GO for starting the measurement and a reset signal RES. The tester 30 can be a rather slow tester having an operating frequency (or clock frequency) as low as 10 MHz for example. The test signal GO and the reset signal RES are not synchronized with the clock signal CLK of the clock generator 20. They are supplied arbitrarily in response to a request for a test. The tester 30 is also supplied with an instruction signal DONE from the IC 10 for ending the measurement and an instruction signal OUT for outputting the resultant measurement data.

Figure 2:
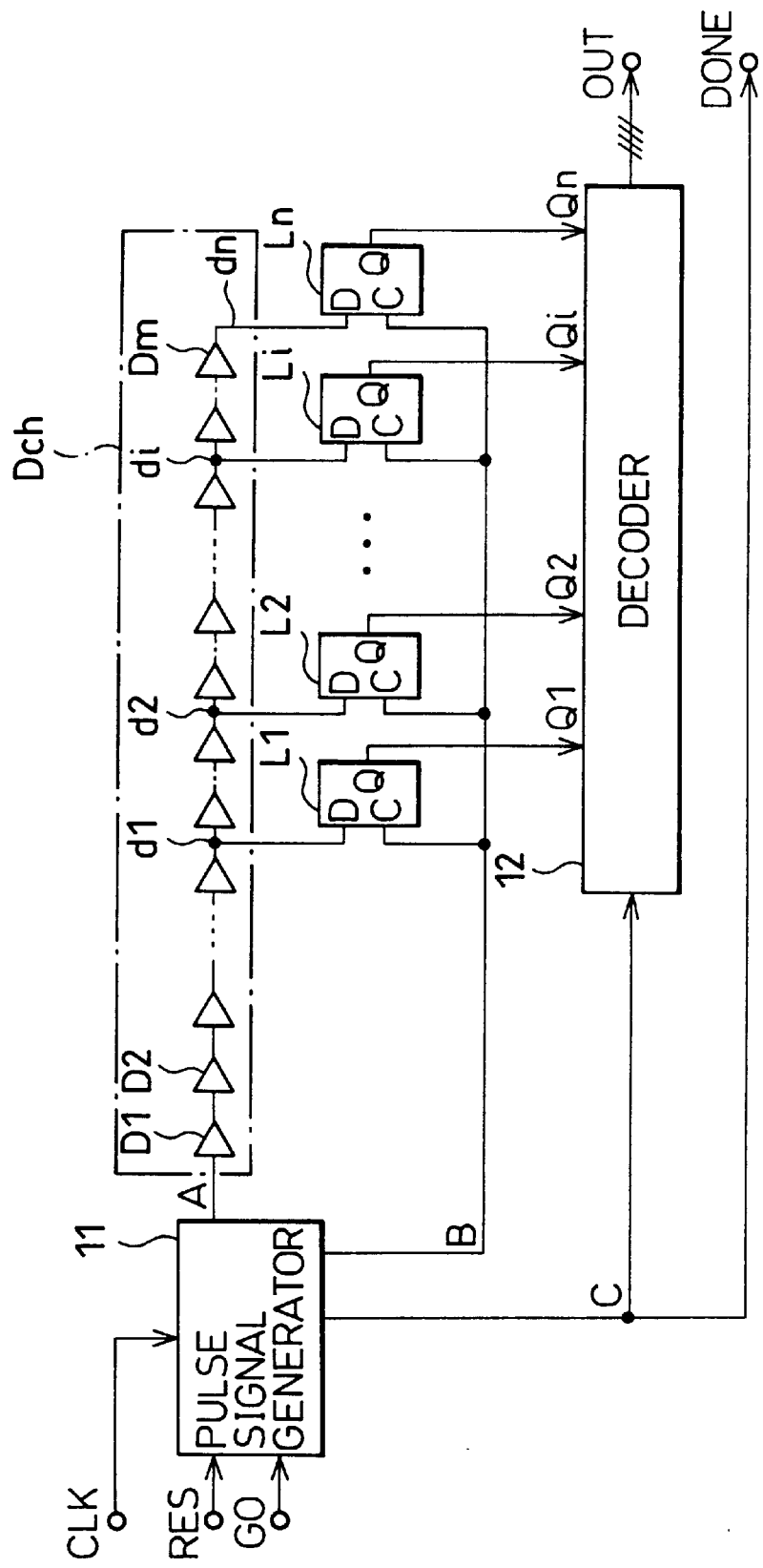
FIG. 2 is a schematic diagram of a measurement circuit incorporated in an IC according to the invention.

FIG. 2 shows a measurement circuit of the invention formed together with other internal elements in the IC 10.

Elements D1–Dm (hereinafter referred to as measurement elements) are buffers in the example shown herein each having enable terminals. These buffers represent standard elements of the IC such as operating elements, contacts, and aluminum lead wires of the IC 10. A predetermined number (e.g. 120) of these buffers or measurement elements are connected in series to form an array Dch.

A first synchronous signal A is entered at an input terminal of the array Dch as a propagating signal, which propagates along the array Dch with a delay in each of the measurement elements or buffers. Each of the buffers provides a predetermined delay associated with the element which it represents.

The measurement elements D1–Dm are fabricated in the same manufacturing process.

The measurement elements D1–Dm need not be buffers. They can be any other types of elements having an average delay time or longer delay times representing the elements of the IC 10.

The array Dch of the measurement elements have a multiplicity of nodes d1–dn each connected to the data terminal D of a corresponding latch circuits L1–Ln. The clock terminals C of the latch circuits L1–Ln are coupled to a second synchronous signal B, while the output terminals Q of the latch circuits are connected to a decoder 12, thereby forming a group of latch circuitries.

Shown in FIG. 2 are a predetermined number n (e.g. 10) of latch circuits L1–Ln connected in the second half of the array Dch. It should be understood, however, that the number as well as the positions of the latch circuits L1–Ln may be arbitrary chosen, depending on the conditions and the resolution of the measurement. For example, they can be provided in the first half of the array Dch, with one latch circuit for each measurement element.

The decoder 12 receives status signals Q1–Qn from the latch circuits L1–Ln and, upon receipt of a third synchronous signal C, decodes the status signals Q1–Qn and outputs the decoded status in the form of numerical data OUT. At the same time, along with the numerical data OUT, the third synchronous signal C is supplied to the external tester 30 as a signal DONE to end the measurement.

The pulse signal generator 11 is supplied with the clock signal CLK along with instruction signals such as a test signal GO and a reset signal RES. Upon receipt of the test signal GO and the reset signal RES, the pulse signal generator issues a first, a second, and a third synchronous signals A, B, and C, respectively, in sequence. More specifically, after the reset signal RES has gone LOW from HIGH and the test signal GO gone HIGH from LOW and moreover the reset signal RES has become HIGH again, the pulse signal generator 11 subsequently generates a first synchronous signal A at the rise of the clock signal CLK, and generates a second and a third synchronous signals B and C in turn at regular time intervals (e.g. 1 clock). In the example shown herein, the intervals of the synchronous signals A, B, and C are 1 clock.

The entire measurement circuit shown in FIG. 2 is incorporated in the IC 10. Assuming that the number of the measurement elements D1–Dm is 120, the measurement circuit of FIG. 2 includes about 400–500 circuit elements. However, this measurement circuit is negligibly small in size compared with the IC 10 which usually accommodates about 100 thousand circuit elements, so that the measurement elements impose no especial functional limitation on the IC 10.

Referring to a timing chart shown in FIG. 3, operation of the measurement circuit of the invention will now be described below.

The clock signal CLK generated by the external clock generator 20 is supplied to the pulse signal generator 11 of the IC 10. In the example shown herein the clock signal CLK has the same operating frequency of 100 MHz say as the nominal operating frequency of the IC 10.

Under this condition, the pulse signal generator 11 also receives as instruction signals a reset signal RES and a test signal GO from a tester 30. The instruction signals are executable when a reset signal RES restores HIGH in the pulse signal generator 11 (near t3) after the rest signal RES has gone LOW once from HIGH (near t1) and the test signal GO has gone HIGH (near t2). The instruction signals are subsequently synchronized under this condition with a clock signal CLK. Thus, in the example shown in FIG. 3, a first synchronous signal A is generated when the clock signal CLK rises at time t4. Similarly, a second synchronous signal B is generated at time t5, 1 clock after the generation of the first synchronous signal A, and a third synchronous signal C is generated at time t6 which is 1 clock after the generation of the second synchronous signal B.

The first synchronous signal A generated by the pulse signal generator 11 is supplied to the input terminal of the array Dch of the series measurement elements D1–Dm as a propagating signal at time t4. Each of the measurement elements D1–Dm receiving the first synchronous signal A generates a HIGH output at its output terminal, which is supplied to the data terminal D of a corresponding latch circuits L1–Ln. Thus, as the propagation signal A propagates through the measurement elements D1–Dm, the corresponding data terminals D of the latch circuits L1–Ln are sequentially raised to HIGH.

At time t5, 1 clock after t4, the second synchronous signal B goes HIGH, raising the level of the clock terminals C of all the latch circuits L1–Ln. Thus, the latch circuits L1–Ln simultaneously latch the status of all the data terminals and hence the status of the nodes d1–dn, and provide the status signals Q1–Qn indicative of the latched status to the decoder 12.

At time t6, 1 clock after the rise of the second synchronous signal B, the third synchronous signal C goes HIGH, causing the decoder 12 to decode the status signals Q1–Qn and output a resultant measurement signal OUT in the form of 4-bit numerical data. The measurement signal OUT is a DC signal, which is supplied to the tester 30 together with the third synchronous signal C now serving as a signal DONE instructing the tester 30 to end the measurement.

The measurement elements D1–Dm used to measure the delay time of the first synchronous signal A are buffers for example which can adequately represent delay properties of typical constituent elements of the IC 10. Since the measurement elements D1–Dm are fabricated together with the constituent elements in the same manufacturing process, the measured data can be regarded as reflecting the characteristics of the constituent elements of the IC 10.

Hence, based on the 4-bit numerical measurement data for a given structure of an IC 10, it is possible to determine if the IC is defective or not, using the tester 30. It is also possible to obtain in numerical value marginal allowance or allowable limits of the operating frequency of the IC 10.

After the measurement of an IC 10, another IC 10 is set up for the measurement in the same manner.

Figure 3:
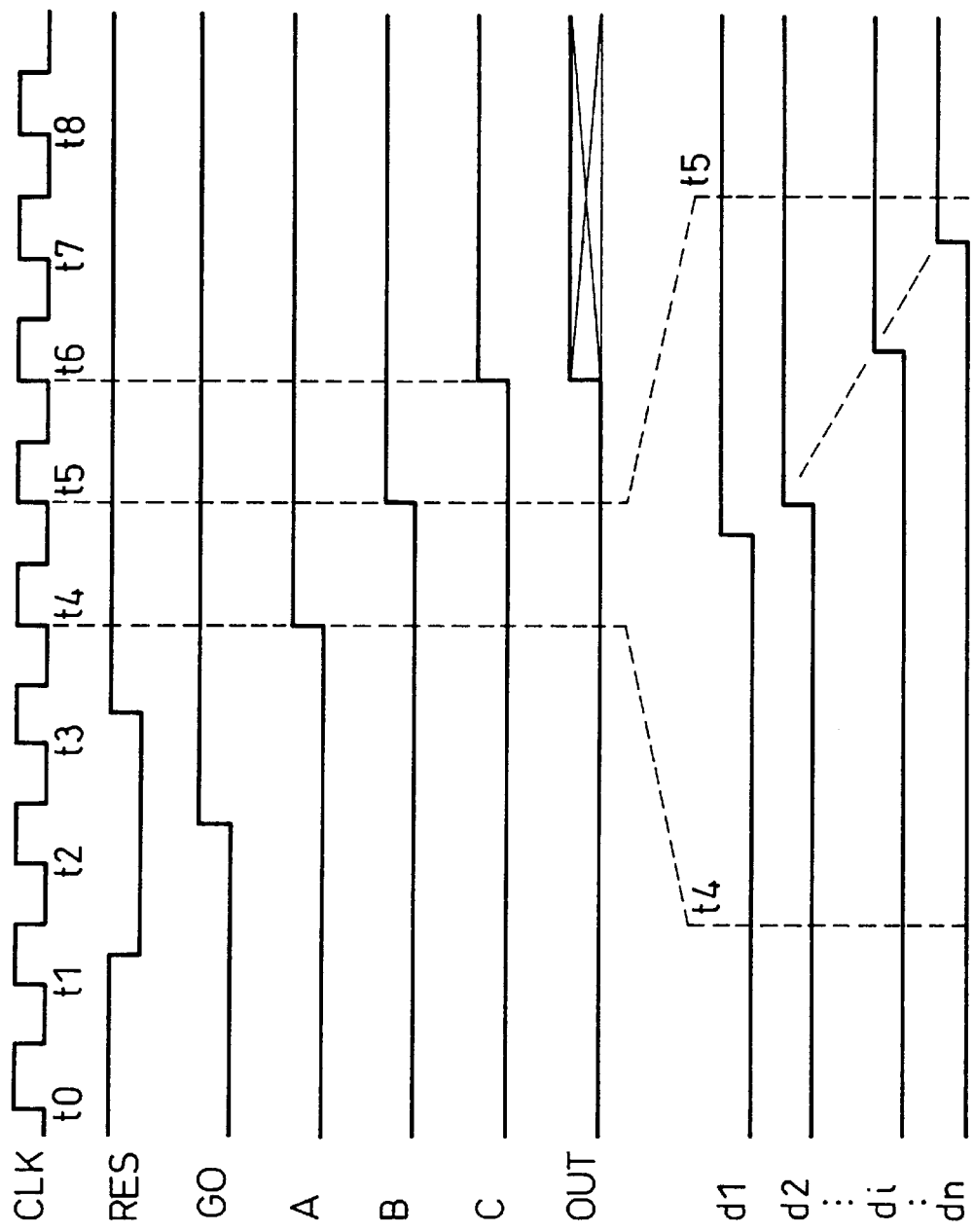
FIG. 3 is a timing chart for the measurement circuit of FIG. 2.

In the example shown herein the first synchronous signal A is shown in the timing chart of FIG. 3 to have propagated through the entire measurement elements D1–Dm within a single clock (t4–t5). However, there can be a case where the first synchronous signal A cannot reach the last measurement element Dm in one clock. However, it would be apparent for a person of skill in the art that the propagation test could be done equally well by the tester.

As described above, the IC 10 of the invention incorporates an array Dch of multiple measurement elements D1–Dm in the form of buffers for example connected in series, representing the internal elements of the IC 10. The array Dch is supplied with a propagation signal in synchronism with a fast clock signal CLK of the IC 10, which enables measurement of the propagation speed of the signal in terms of the number of the measurement elements in the array through which the signal has passed in one clock interval. This can be done by simply supplying the IC 10 with such instruction signals as a test signal GO and a reset signal RES from an external tester. It should be appreciated that a tester which is slower than the IC 10 can be used in the measurement of the operating frequency of the IC.

In the example shown above, the clock signal CLK generated by the clock signal generator 20 is set to the nominal frequency of the IC, 100 MHz say. It should be noted, however, that the frequency of the clock signal CLK can be set to a higher frequency of 120 MHz or a lower frequency of 80 MHz for example.

Using these clock signals, it is possible to analyze in detail the marginal allowance or allowable limits of the operating frequency of the IC 10. Additional measurements of the operating speed of the IC for different frequencies will help improve the resolution of the measurement.

What we claim is:

1. A semiconductor integrated circuit device having a multiplicity of elements, comprising:

a predetermined number of measuring elements connected in series forming an array of measurement elements; and detection means for simultaneously detecting the electric potentials at predetermined nodes in said array, and for outputting the detected potentials in the form of numerical data, wherein the array of measuring elements is provided at the input terminal thereof with a propagation signal; and the detection means are provided with a delayed detection signal a predetermined time after the application of the propagation signal to the array.

2. The semiconductor integrated circuit device according to claim 1, wherein the means for detecting the potentials comprise:

a multiplicity of latch circuits having a multiplicity of latch outputs operable in response to the delayed detection signal upon receipt of a latch signal; and a decoder receiving the multiplicity of latch outputs of the latch circuits, converting the multiplicity of latch outputs into numerical data, and providing the numerical data.

3. The semiconductor integrated circuit device according to claim 2, further comprising a pulse signal generator adapted to generate:

the propagation signal in response to an externally applied instruction signal and in synchronization with a given clock signal; and the detection signal delayed behind the propagation signal by a predetermined number of clocks.

4. The semiconductor integrated circuit device according to claim 3, wherein the pulse signal generator further generates a decode signal delayed behind the detection signal by an arbitrary time.

5. The semiconductor integrated circuit device according to claim 3, wherein the clock signal is the internal clock signal of the semiconductor integrated circuit device.

6. The semiconductor integrated circuit device according to claim 3, wherein the clock signal is externally provided.

7. The semiconductor integrated circuit device according to claim 1, wherein the array of measurement elements includes a predetermined number of buffers.

* * * * *